United States Patent
Wang et al.

(10) Patent No.: US 8,637,955 B1
(45) Date of Patent: Jan. 28, 2014

(54) SEMICONDUCTOR STRUCTURE WITH REDUCED JUNCTION LEAKAGE AND METHOD OF FABRICATION THEREOF

(75) Inventors: Lingquan Wang, Los Gatos, CA (US); Teymur Bakhishev, San Jose, CA (US); Dalong Zhao, San Jose, AZ (US); Pushkar Ranade, Los Gatos, CA (US); Sameer Pradhan, San Jose, CA (US); Thomas Hoffmann, Los Gatos, CA (US); Lucian Shifren, San Jose, CA (US); Lance Scudder, Sunnyvale, CA (US)

(73) Assignee: SuVolta, Inc., Los Gatos, CA (US)

( * ) Notice: Subject to any disclaimer, the term of this patent is extended or adjusted under 35 U.S.C. 154(b) by 0 days.

(21) Appl. No.: 13/600,647

(22) Filed: Aug. 31, 2012

(51) Int. Cl.
 *H01L 29/15* (2006.01)
 *H01L 29/167* (2006.01)
 *H01L 29/36* (2006.01)

(52) U.S. Cl.
 USPC 257/506; 257/74; 257/E29.027; 257/E29.025; 438/565; 438/545; 438/508; 438/762; 438/492

(58) Field of Classification Search
 None
 See application file for complete search history.

(56) References Cited

U.S. PATENT DOCUMENTS

| | | |
|---|---|---|
| 3,958,266 A | 5/1976 | Athanas |
| 4,000,504 A | 12/1976 | Berger |
| 4,021,835 A | 5/1977 | Etoh et al. |
| 4,242,691 A | 12/1980 | Kotani et al. |
| 4,276,095 A | 6/1981 | Beilstein, Jr. et al. |
| 4,315,781 A | 2/1982 | Henderson |
| 4,518,926 A | 5/1985 | Swanson |
| 4,559,091 A | 12/1985 | Allen et al. |
| 4,578,128 A | 3/1986 | Mundt et al. |
| 4,617,066 A | 10/1986 | Vasudev |
| 4,662,061 A | 5/1987 | Malhi |
| 4,761,384 A | 8/1988 | Neppl et al. |

(Continued)

FOREIGN PATENT DOCUMENTS

| | | |
|---|---|---|
| EP | 0274278 | 7/1988 |
| EP | 0312237 | 4/1989 |

(Continued)

OTHER PUBLICATIONS

Komaragiri, R. et al., "Depletion-Free Poly Gate Electrode Architecture for Sub 100 Nanometer CMOS Devices with High-K Gate Dielectrics", IEEE IEDM Tech Dig., San Francisco CA, 833-836, Dec. 13-15, 2004.

(Continued)

*Primary Examiner* — Thomas L Dickey
*Assistant Examiner* — Joseph Schoenholtz
(74) *Attorney, Agent, or Firm* — Baker Botts L.L.P.

(57) ABSTRACT

A semiconductor structure is formed with a NFET device and a PFET device. The NFET device is formed by masking the PFET device regions of a substrate, forming a screen layer through epitaxial growth and in-situ doping, and forming an undoped channel layer on the screen layer through epitaxial growth. The PFET device is similarly formed by masking the NFET regions of a substrate, forming a screen layer through epitaxial growth and in-situ doping, and forming an undoped channel layer on the screen layer through epitaxial growth. An isolation region is formed between the NFET and the PFET device areas to remove any facets occurring during the separate epitaxial growth phases. By forming the screen layer through in-situ doped epitaxial growth, a reduction in junction leakage is achieved versus forming the screen layer using ion, implantation.

20 Claims, 4 Drawing Sheets

(56) References Cited

U.S. PATENT DOCUMENTS

| | | |
|---|---|---|
| 4,780,748 A | 10/1988 | Cunningham et al. |
| 4,819,043 A | 4/1989 | Yazawa et al. |
| 4,885,477 A | 12/1989 | Bird et al. |
| 4,908,681 A | 3/1990 | Nishida et al. |
| 4,945,254 A | 7/1990 | Robbins |
| 4,956,311 A | 9/1990 | Liou et al. |
| 5,034,337 A | 7/1991 | Mosher et al. |
| 5,144,378 A | 9/1992 | Hikosaka |
| 5,156,989 A | 10/1992 | Williams et al. |
| 5,156,990 A | 10/1992 | Mitchell |
| 5,166,765 A | 11/1992 | Lee et al. |
| 5,208,473 A | 5/1993 | Komori et al. |
| 5,294,821 A | 3/1994 | Iwamatsu |
| 5,298,763 A | 3/1994 | Shen et al. |
| 5,369,288 A | 11/1994 | Usuki |
| 5,373,186 A | 12/1994 | Schubert et al. |
| 5,384,476 A | 1/1995 | Nishizawa et al. |
| 5,426,328 A | 6/1995 | Yilmaz et al. |
| 5,444,008 A | 8/1995 | Han et al. |
| 5,552,332 A | 9/1996 | Tseng et al. |
| 5,559,368 A | 9/1996 | Hu et al. |
| 5,608,253 A | 3/1997 | Liu et al. |
| 5,622,880 A | 4/1997 | Burr et al. |
| 5,624,863 A | 4/1997 | Helm et al. |
| 5,625,568 A | 4/1997 | Edwards et al. |
| 5,641,980 A | 6/1997 | Yamaguchi et al. |
| 5,663,583 A | 9/1997 | Matloubian et al. |
| 5,712,501 A | 1/1998 | Davies et al. |
| 5,719,422 A | 2/1998 | Burr et al. |
| 5,726,488 A | 3/1998 | Watanabe et al. |
| 5,726,562 A | 3/1998 | Mizuno |
| 5,731,626 A | 3/1998 | Eaglesham et al. |
| 5,736,419 A | 4/1998 | Naem |
| 5,753,555 A | 5/1998 | Hada |
| 5,754,826 A | 5/1998 | Gamal et al. |
| 5,756,365 A | 5/1998 | Kakumu |
| 5,763,921 A | 6/1998 | Okumura et al. |
| 5,780,899 A | 7/1998 | Hu et al. |
| 5,847,419 A | 12/1998 | Imai et al. |
| 5,856,003 A | 1/1999 | Chiu |
| 5,861,334 A | 1/1999 | Rho |
| 5,877,049 A | 3/1999 | Liu et al. |
| 5,885,876 A | 3/1999 | Dennen |
| 5,889,315 A | 3/1999 | Farrenkopf et al. |
| 5,895,954 A | 4/1999 | Yasumura et al. |
| 5,899,714 A | 5/1999 | Farremkopf et al. |
| 5,918,129 A | 6/1999 | Fulford, Jr. et al. |
| 5,923,067 A | 7/1999 | Voldman |
| 5,923,987 A | 7/1999 | Burr |
| 5,936,868 A | 8/1999 | Hall |
| 5,946,214 A | 8/1999 | Heavlin et al. |
| 5,985,705 A | 11/1999 | Seliskar |
| 5,989,963 A | 11/1999 | Luning et al. |
| 6,001,695 A | 12/1999 | Wu |
| 6,020,227 A | 2/2000 | Bulucea |
| 6,043,139 A | 3/2000 | Eaglesham et al. |
| 6,060,345 A | 5/2000 | Hause et al. |
| 6,060,364 A | 5/2000 | Maszara et al. |
| 6,066,533 A | 5/2000 | Yu |
| 6,072,217 A | 6/2000 | Burr |
| 6,087,210 A | 7/2000 | Sohn |
| 6,087,691 A | 7/2000 | Hamamoto |
| 6,088,518 A | 7/2000 | Hsu |
| 6,091,286 A | 7/2000 | Blauschild |
| 6,096,611 A | 8/2000 | Wu |
| 6,103,562 A | 8/2000 | Son et al. |
| 6,121,153 A | 9/2000 | Kikkawa |
| 6,147,383 A | 11/2000 | Kuroda |
| 6,153,920 A | 11/2000 | Gossmann et al. |
| 6,157,073 A | 12/2000 | Lehongres |
| 6,175,582 B1 | 1/2001 | Naito et al. |
| 6,184,112 B1 | 2/2001 | Maszara et al. |
| 6,190,979 B1 | 2/2001 | Radens et al. |
| 6,194,259 B1 | 2/2001 | Nayak et al. |
| 6,198,157 B1 | 3/2001 | Ishida et al. |
| 6,218,892 B1 | 4/2001 | Soumyanath et al. |
| 6,218,895 B1 | 4/2001 | De et al. |
| 6,221,724 B1 | 4/2001 | Yu et al. |
| 6,229,188 B1 | 5/2001 | Aoki et al. |
| 6,232,164 B1 | 5/2001 | Tsai et al. |
| 6,235,597 B1 | 5/2001 | Miles |
| 6,245,618 B1 | 6/2001 | An et al. |
| 6,268,640 B1 | 7/2001 | Park et al. |
| 6,271,070 B2 | 8/2001 | Kotani et al. |
| 6,271,551 B1 | 8/2001 | Schmitz et al. |
| 6,288,429 B1 | 9/2001 | Iwata et al. |
| 6,297,132 B1 | 10/2001 | Zhang et al. |
| 6,300,177 B1 | 10/2001 | Sundaresan et al. |
| 6,313,489 B1 | 11/2001 | Letavic et al. |
| 6,319,799 B1 | 11/2001 | Ouyang et al. |
| 6,320,222 B1 | 11/2001 | Forbes et al. |
| 6,323,525 B1 | 11/2001 | Noguchi et al. |
| 6,326,666 B1 | 12/2001 | Bernstein et al. |
| 6,335,233 B1 | 1/2002 | Cho et al. |
| 6,358,806 B1 | 3/2002 | Puchner |
| 6,380,019 B1 | 4/2002 | Yu et al. |
| 6,391,752 B1 | 5/2002 | Colinge et al. |
| 6,426,260 B1 | 7/2002 | Hshieh |
| 6,426,279 B1 | 7/2002 | Huster et al. |
| 6,432,754 B1 | 8/2002 | Assaderaghi et al. |
| 6,444,550 B1 | 9/2002 | Hao et al. |
| 6,444,551 B1 | 9/2002 | Ku et al. |
| 6,449,749 B1 | 9/2002 | Stine |
| 6,461,920 B1 | 10/2002 | Shirahata |
| 6,461,928 B2 | 10/2002 | Rodder |
| 6,472,278 B1 | 10/2002 | Marshall et al. |
| 6,482,714 B1 | 11/2002 | Hieda et al. |
| 6,489,224 B1 | 12/2002 | Burr |
| 6,492,232 B1 | 12/2002 | Tang et al. |
| 6,500,739 B1 | 12/2002 | Wang et al. |
| 6,503,801 B1 | 1/2003 | Rouse et al. |
| 6,503,805 B2 | 1/2003 | Wang et al. |
| 6,506,640 B1 | 1/2003 | Ishida et al. |
| 6,518,623 B1 | 2/2003 | Oda et al. |
| 6,521,470 B1 | 2/2003 | Lin et al. |
| 6,534,373 B1 | 3/2003 | Yu |
| 6,541,328 B2 | 4/2003 | Whang et al. |
| 6,541,829 B2 | 4/2003 | Nishinohara et al. |
| 6,548,842 B1 | 4/2003 | Bulucea et al. |
| 6,551,885 B1 | 4/2003 | Yu |
| 6,552,377 B1 | 4/2003 | Yu |
| 6,573,129 B2 | 6/2003 | Hoke et al. |
| 6,576,535 B2 | 6/2003 | Drobny et al. |
| 6,600,200 B1 | 7/2003 | Lustig et al. |
| 6,620,671 B1 | 9/2003 | Wang et al. |
| 6,624,488 B1 | 9/2003 | Kim |
| 6,627,473 B1 | 9/2003 | Oikawa et al. |
| 6,630,710 B1 | 10/2003 | Augusto |
| 6,660,605 B1 | 12/2003 | Liu |
| 6,662,350 B2 | 12/2003 | Fried et al. |
| 6,667,200 B2 | 12/2003 | Sohn et al. |
| 6,670,260 B1 | 12/2003 | Yu et al. |
| 6,693,333 B1 | 2/2004 | Yu |
| 6,730,568 B2 | 5/2004 | Sohn |
| 6,737,724 B2 | 5/2004 | Hieda et al. |
| 6,743,291 B2 | 6/2004 | Ang et al. |
| 6,743,684 B2 | 6/2004 | Liu |
| 6,751,519 B1 | 6/2004 | Satya et al. |
| 6,753,230 B2 | 6/2004 | Sohn et al. |
| 6,760,900 B2 | 7/2004 | Rategh et al. |
| 6,770,944 B2 | 8/2004 | Nishinohara et al. |
| 6,787,424 B1 | 9/2004 | Yu |
| 6,797,553 B2 | 9/2004 | Adkisson et al. |
| 6,797,602 B1 | 9/2004 | Kluth et al. |
| 6,797,994 B1 | 9/2004 | Hoke et al. |
| 6,808,004 B2 | 10/2004 | Kamm et al. |
| 6,808,994 B2 | 10/2004 | Wang |
| 6,813,750 B2 | 11/2004 | Usami et al. |
| 6,821,825 B2 | 11/2004 | Todd et al. |
| 6,821,852 B2 | 11/2004 | Rhodes |
| 6,822,297 B2 | 11/2004 | Nandakumar et al. |
| 6,831,292 B2 | 12/2004 | Currie et al. |
| 6,835,639 B2 | 12/2004 | Rotondaro et al. |
| 6,852,602 B2 | 2/2005 | Kanzawa et al. |

(56) References Cited

U.S. PATENT DOCUMENTS

| | | |
|---|---|---|
| 6,852,603 B2 | 2/2005 | Chakravarthi et al. |
| 6,881,641 B2 | 4/2005 | Wieczorek et al. |
| 6,881,987 B2 | 4/2005 | Sohn |
| 6,891,439 B2 | 5/2005 | Jachne et al. |
| 6,893,947 B2 | 5/2005 | Martinez et al. |
| 6,900,519 B2 | 5/2005 | Cantell et al. |
| 6,901,564 B2 | 5/2005 | Stine et al. |
| 6,916,698 B2 | 7/2005 | Mocuta et al. |
| 6,917,237 B1 | 7/2005 | Tschanz et al. |
| 6,927,463 B2 | 8/2005 | Iwata et al. |
| 6,928,128 B1 | 8/2005 | Sidiropoulos |
| 6,930,007 B2 | 8/2005 | Bu et al. |
| 6,930,360 B2 | 8/2005 | Yamauchi et al. |
| 6,936,509 B2 | 8/2005 | Coolbaugh et al. |
| 6,957,163 B2 | 10/2005 | Ando |
| 6,963,090 B2 | 11/2005 | Passlack et al. |
| 6,995,397 B2 | 2/2006 | Yamashita et al. |
| 7,002,214 B1 | 2/2006 | Boyd et al. |
| 7,008,836 B2 | 3/2006 | Algotsson et al. |
| 7,013,359 B1 | 3/2006 | Li |
| 7,015,546 B2 | 3/2006 | Herr et al. |
| 7,015,741 B2 | 3/2006 | Tschanz et al. |
| 7,022,559 B2 | 4/2006 | Barnak et al. |
| 7,036,098 B2 | 4/2006 | Eleyan et al. |
| 7,038,258 B2 | 5/2006 | Liu et al. |
| 7,039,881 B2 | 5/2006 | Regan |
| 7,045,456 B2 | 5/2006 | Murto et al. |
| 7,057,216 B2 | 6/2006 | Ouyang et al. |
| 7,061,058 B2 | 6/2006 | Chakravarthi et al. |
| 7,064,039 B2 | 6/2006 | Liu |
| 7,064,399 B2 | 6/2006 | Babcock et al. |
| 7,071,103 B2 | 7/2006 | Chan et al. |
| 7,078,325 B2 | 7/2006 | Curello et al. |
| 7,078,776 B2 | 7/2006 | Nishinohara et al. |
| 7,089,513 B2 | 8/2006 | Bard et al. |
| 7,089,515 B2 | 8/2006 | Hanafi et al. |
| 7,091,093 B1 | 8/2006 | Noda et al. |
| 7,105,399 B1 | 9/2006 | Dakshina-Murthy et al. |
| 7,109,099 B2 | 9/2006 | Tan et al. |
| 7,119,381 B2 | 10/2006 | Passlack |
| 7,122,411 B2 | 10/2006 | Mouli |
| 7,127,687 B1 | 10/2006 | Signore |
| 7,132,323 B2 | 11/2006 | Haensch et al. |
| 7,169,675 B2 | 1/2007 | Tan et al. |
| 7,170,120 B2 | 1/2007 | Datta et al. |
| 7,176,137 B2 | 2/2007 | Perng et al. |
| 7,186,598 B2 | 3/2007 | Yamauchi et al. |
| 7,189,627 B2 | 3/2007 | Wu et al. |
| 7,199,430 B2 | 4/2007 | Babcock et al. |
| 7,202,517 B2 | 4/2007 | Dixit et al. |
| 7,208,354 B2 | 4/2007 | Bauer |
| 7,211,871 B2 | 5/2007 | Cho |
| 7,221,021 B2 | 5/2007 | Wu et al. |
| 7,223,646 B2 | 5/2007 | Miyashita et al. |
| 7,226,833 B2 | 6/2007 | White et al. |
| 7,226,843 B2 | 6/2007 | Weber et al. |
| 7,230,680 B2 | 6/2007 | Fujisawa et al. |
| 7,235,822 B2 | 6/2007 | Li |
| 7,256,639 B1 | 8/2007 | Koniaris et al. |
| 7,259,428 B2 | 8/2007 | Inaba |
| 7,260,562 B2 | 8/2007 | Czajkowski et al. |
| 7,294,877 B2 | 11/2007 | Rueckes et al. |
| 7,297,994 B2 | 11/2007 | Wieczorek et al. |
| 7,301,208 B2 | 11/2007 | Handa et al. |
| 7,304,350 B2 | 12/2007 | Misaki |
| 7,307,471 B2 | 12/2007 | Gammie et al. |
| 7,312,500 B2 | 12/2007 | Miyashita et al. |
| 7,323,754 B2 | 1/2008 | Ema et al. |
| 7,332,439 B2 | 2/2008 | Lindert et al. |
| 7,332,790 B2 | 2/2008 | Gonzalez et al. |
| 7,348,629 B2 | 3/2008 | Chu et al. |
| 7,354,833 B2 | 4/2008 | Liaw |
| 7,380,225 B2 | 5/2008 | Joshi et al. |
| 7,398,497 B2 | 7/2008 | Sato et al. |
| 7,402,207 B1 | 7/2008 | Besser et al. |
| 7,402,872 B2 | 7/2008 | Murthy et al. |
| 7,416,605 B2 | 8/2008 | Zollner et al. |
| 7,427,788 B2 | 9/2008 | Li et al. |
| 7,439,164 B2 | 10/2008 | Langdo et al. |
| 7,442,971 B2 | 10/2008 | Wirbeleit et al. |
| 7,449,733 B2 | 11/2008 | Inaba et al. |
| 7,462,908 B2 | 12/2008 | Bol et al. |
| 7,469,164 B2 | 12/2008 | Du-Nour |
| 7,470,593 B2 | 12/2008 | Rouh et al. |
| 7,485,536 B2 | 2/2009 | Jin et al. |
| 7,487,474 B2 | 2/2009 | Ciplickas et al. |
| 7,491,988 B2 | 2/2009 | Tolchinsky et al. |
| 7,494,861 B2 | 2/2009 | Chu et al. |
| 7,496,862 B2 | 2/2009 | Chang et al. |
| 7,496,867 B2 | 2/2009 | Turner et al. |
| 7,498,637 B2 | 3/2009 | Yamaoka et al. |
| 7,501,324 B2 | 3/2009 | Babcock et al. |
| 7,503,020 B2 | 3/2009 | Allen et al. |
| 7,507,999 B2 | 3/2009 | Kusumoto et al. |
| 7,514,766 B2 | 4/2009 | Yoshida |
| 7,521,323 B2 | 4/2009 | Surdeanu et al. |
| 7,531,393 B2 | 5/2009 | Doyle et al. |
| 7,531,836 B2 | 5/2009 | Liu et al. |
| 7,538,364 B2 | 5/2009 | Twynam |
| 7,538,412 B2 | 5/2009 | Schulze et al. |
| 7,562,233 B1 | 7/2009 | Sheng et al. |
| 7,564,105 B2 | 7/2009 | Chi et al. |
| 7,566,600 B2 | 7/2009 | Mouli |
| 7,569,456 B2 | 8/2009 | Ko et al. |
| 7,586,322 B1 | 9/2009 | Xu et al. |
| 7,592,241 B2 | 9/2009 | Takao |
| 7,595,243 B1 | 9/2009 | Bulucea et al. |
| 7,598,142 B2 | 10/2009 | Ranade et al. |
| 7,605,041 B2 | 10/2009 | Ema et al. |
| 7,605,060 B2 | 10/2009 | Meunier-Beillard et al. |
| 7,605,429 B2 | 10/2009 | Bernstein et al. |
| 7,608,496 B2 | 10/2009 | Chu |
| 7,615,802 B2 | 11/2009 | Elpelt et al. |
| 7,622,341 B2 | 11/2009 | Chudzik et al. |
| 7,638,380 B2 | 12/2009 | Pearce |
| 7,642,140 B2 | 1/2010 | Bae et al. |
| 7,644,377 B1 | 1/2010 | Saxe et al. |
| 7,645,665 B2 | 1/2010 | Kubo et al. |
| 7,651,920 B2 | 1/2010 | Siprak |
| 7,655,523 B2 | 2/2010 | Babcock et al. |
| 7,673,273 B2 | 3/2010 | Madurawe et al. |
| 7,675,126 B2 | 3/2010 | Cho |
| 7,675,317 B2 | 3/2010 | Perisetty |
| 7,678,638 B2 | 3/2010 | Chu et al. |
| 7,681,628 B2 | 3/2010 | Joshi et al. |
| 7,682,887 B2 | 3/2010 | Dokumaci et al. |
| 7,683,442 B1 | 3/2010 | Burr et al. |
| 7,696,000 B2 | 4/2010 | Liu et al. |
| 7,704,822 B2 | 4/2010 | Jeong |
| 7,704,844 B2 | 4/2010 | Zhu et al. |
| 7,709,828 B2 | 5/2010 | Braithwaite et al. |
| 7,723,750 B2 | 5/2010 | Zhu et al. |
| 7,737,472 B2 | 6/2010 | Kondo et al. |
| 7,741,138 B2 | 6/2010 | Cho |
| 7,741,200 B2 | 6/2010 | Cho et al. |
| 7,745,270 B2 | 6/2010 | Shah et al. |
| 7,750,374 B2 | 7/2010 | Capasso et al. |
| 7,750,381 B2 | 7/2010 | Hokazono et al. |
| 7,750,405 B2 | 7/2010 | Nowak |
| 7,750,682 B2 | 7/2010 | Bernstein et al. |
| 7,755,144 B2 | 7/2010 | Li et al. |
| 7,755,146 B2 | 7/2010 | Helm et al. |
| 7,759,206 B2 | 7/2010 | Luo et al. |
| 7,759,714 B2 | 7/2010 | Itoh et al. |
| 7,761,820 B2 | 7/2010 | Berger et al. |
| 7,795,677 B2 | 9/2010 | Bangsaruntip et al. |
| 7,808,045 B2 | 10/2010 | Kawahara et al. |
| 7,808,082 B2 | 10/2010 | Yang et al. |
| 7,808,410 B2 | 10/2010 | Kim et al. |
| 7,811,873 B2 | 10/2010 | Mochizuki |
| 7,811,881 B2 | 10/2010 | Cheng et al. |
| 7,818,702 B2 | 10/2010 | Mandelman et al. |
| 7,821,066 B2 | 10/2010 | Lebby et al. |
| 7,829,402 B2 | 11/2010 | Matocha et al. |

(56) References Cited

U.S. PATENT DOCUMENTS

| | | |
|---|---|---|
| 7,831,873 B1 | 11/2010 | Trimberger et al. |
| 7,846,822 B2 | 12/2010 | Seebauer et al. |
| 7,855,118 B2 | 12/2010 | Hoentschel et al. |
| 7,859,013 B2 | 12/2010 | Chen et al. |
| 7,863,163 B2 | 1/2011 | Bauer |
| 7,867,835 B2 | 1/2011 | Lee et al. |
| 7,883,977 B2 | 2/2011 | Babcock et al. |
| 7,888,205 B2 | 2/2011 | Herner et al. |
| 7,888,747 B2 | 2/2011 | Hokazono |
| 7,895,546 B2 | 2/2011 | Lahner et al. |
| 7,897,495 B2 | 3/2011 | Ye et al. |
| 7,906,413 B2 | 3/2011 | Cardone et al. |
| 7,906,813 B2 | 3/2011 | Kato |
| 7,910,419 B2 | 3/2011 | Fenouillet-Beranger et al. |
| 7,919,791 B2 | 4/2011 | Flynn et al. |
| 7,926,018 B2 | 4/2011 | Moroz et al. |
| 7,935,984 B2 | 5/2011 | Nakano |
| 7,941,776 B2 | 5/2011 | Majumder et al. |
| 7,945,800 B2 | 5/2011 | Gomm et al. |
| 7,948,008 B2 | 5/2011 | Liu et al. |
| 7,952,147 B2 | 5/2011 | Ueno et al. |
| 7,960,232 B2 | 6/2011 | King et al. |
| 7,960,238 B2 | 6/2011 | Kohli et al. |
| 7,968,385 B2 | 6/2011 | Jeong et al. |
| 7,968,411 B2 | 6/2011 | Williford |
| 7,968,440 B2 | 6/2011 | Seebauer |
| 7,968,459 B2 | 6/2011 | Bedell et al. |
| 7,989,900 B2 | 8/2011 | Haensch et al. |
| 7,994,573 B2 | 8/2011 | Pan |
| 8,004,024 B2 | 8/2011 | Furukawa et al. |
| 8,012,827 B2 | 9/2011 | Yu et al. |
| 8,029,620 B2 | 10/2011 | Kim et al. |
| 8,039,332 B2 | 10/2011 | Bernard et al. |
| 8,046,598 B2 | 10/2011 | Lee |
| 8,048,791 B2 | 11/2011 | Hargrove et al. |
| 8,048,810 B2 | 11/2011 | Tsai et al. |
| 8,051,340 B2 | 11/2011 | Cranford, Jr. et al. |
| 8,053,340 B2 | 11/2011 | Colombeau et al. |
| 8,063,466 B2 | 11/2011 | Kurita |
| 8,067,279 B2 | 11/2011 | Sadra et al. |
| 8,067,280 B2 | 11/2011 | Wang et al. |
| 8,067,302 B2 | 11/2011 | Li |
| 8,076,719 B2 | 12/2011 | Zeng et al. |
| 8,097,529 B2 | 1/2012 | Krull et al. |
| 8,103,983 B2 | 1/2012 | Agarwal et al. |
| 8,105,891 B2 | 1/2012 | Yeh et al. |
| 8,106,424 B2 | 1/2012 | Schruefer |
| 8,106,481 B2 | 1/2012 | Rao |
| 8,110,487 B2 | 2/2012 | Griebenow et al. |
| 8,114,761 B2 | 2/2012 | Mandrekar et al. |
| 8,119,482 B2 | 2/2012 | Bhalla et al. |
| 8,120,069 B2 | 2/2012 | Hynecek |
| 8,129,246 B2 | 3/2012 | Babcock et al. |
| 8,129,797 B2 | 3/2012 | Chen et al. |
| 8,134,159 B2 | 3/2012 | Hokazono |
| 8,143,120 B2 | 3/2012 | Kerr et al. |
| 8,143,124 B2 | 3/2012 | Challa et al. |
| 8,143,678 B2 | 3/2012 | Kim et al. |
| 8,148,774 B2 | 4/2012 | Mori et al. |
| 8,163,619 B2 | 4/2012 | Yang et al. |
| 8,169,002 B2 | 5/2012 | Chang et al. |
| 8,170,857 B2 | 5/2012 | Joshi et al. |
| 8,173,499 B2 | 5/2012 | Chung et al. |
| 8,173,502 B2 | 5/2012 | Yan et al. |
| 8,176,461 B1 | 5/2012 | Trimberger |
| 8,178,430 B2 | 5/2012 | Kim et al. |
| 8,179,530 B2 | 5/2012 | Levy et al. |
| 8,183,096 B2 | 5/2012 | Wirbeleit |
| 8,183,107 B2 | 5/2012 | Mathur et al. |
| 8,185,865 B2 | 5/2012 | Gupta et al. |
| 8,187,959 B2 | 5/2012 | Pawlak et al. |
| 8,188,542 B2 | 5/2012 | Yoo et al. |
| 8,196,545 B2 | 6/2012 | Kurosawa |
| 8,201,122 B2 | 6/2012 | Dewey, III et al. |
| 8,214,190 B2 | 7/2012 | Joshi et al. |
| 8,216,906 B2 | 7/2012 | Tsai et al. |
| 8,217,423 B2 | 7/2012 | Liu et al. |
| 8,225,255 B2 | 7/2012 | Ouyang et al. |
| 8,227,307 B2 | 7/2012 | Chen et al. |
| 8,236,661 B2 | 8/2012 | Dennard et al. |
| 8,239,803 B2 | 8/2012 | Kobayashi |
| 8,247,300 B2 | 8/2012 | Babcock et al. |
| 8,255,843 B2 | 8/2012 | Chen et al. |
| 8,258,026 B2 | 9/2012 | Bulucea |
| 8,266,567 B2 | 9/2012 | El Yahyaoui et al. |
| 8,286,180 B2 | 10/2012 | Foo |
| 8,288,798 B2 | 10/2012 | Passlack |
| 8,299,562 B2 | 10/2012 | Li et al. |
| 8,324,059 B2 | 12/2012 | Guo et al. |
| 8,377,783 B2 * | 2/2013 | Shifren et al. ............... 438/289 |
| 8,421,162 B2 * | 4/2013 | Shifren et al. ............... 257/392 |
| 2001/0014495 A1 | 8/2001 | Yu |
| 2002/0042184 A1 | 4/2002 | Nandakumar et al. |
| 2003/0006415 A1 | 1/2003 | Yokogawa et al. |
| 2003/0047763 A1 | 3/2003 | Hieda et al. |
| 2003/0122203 A1 * | 7/2003 | Nishinohara et al. ......... 257/402 |
| 2003/0173626 A1 | 9/2003 | Burr |
| 2003/0183856 A1 | 10/2003 | Wieczorek et al. |
| 2003/0215992 A1 | 11/2003 | Sohn et al. |
| 2004/0075118 A1 | 4/2004 | Heinemann et al. |
| 2004/0075143 A1 | 4/2004 | Bae et al. |
| 2004/0084731 A1 | 5/2004 | Matsuda et al. |
| 2004/0087090 A1 | 5/2004 | Grudowski et al. |
| 2004/0126947 A1 | 7/2004 | Sohn |
| 2004/0175893 A1 | 9/2004 | Vatus et al. |
| 2004/0180488 A1 | 9/2004 | Lee |
| 2005/0106824 A1 | 5/2005 | Alberto et al. |
| 2005/0116282 A1 | 6/2005 | Pattanayak et al. |
| 2005/0250289 A1 | 11/2005 | Babcock et al. |
| 2005/0280075 A1 | 12/2005 | Ema et al. |
| 2006/0022270 A1 | 2/2006 | Boyd et al. |
| 2006/0049464 A1 | 3/2006 | Rao |
| 2006/0068555 A1 | 3/2006 | Zhu et al. |
| 2006/0068586 A1 | 3/2006 | Pain |
| 2006/0071278 A1 | 4/2006 | Takao |
| 2006/0154428 A1 | 7/2006 | Dokumaci |
| 2006/0197158 A1 | 9/2006 | Babcock et al. |
| 2006/0203581 A1 | 9/2006 | Joshi et al. |
| 2006/0220114 A1 | 10/2006 | Miyashita et al. |
| 2006/0223248 A1 | 10/2006 | Venugopal et al. |
| 2006/0255412 A1 * | 11/2006 | Ramaswamy et al. ........ 257/368 |
| 2007/0040222 A1 | 2/2007 | Van Camp et al. |
| 2007/0117326 A1 | 5/2007 | Tan et al. |
| 2007/0158790 A1 | 7/2007 | Rao |
| 2007/0212861 A1 | 9/2007 | Chidambarrao et al. |
| 2007/0238253 A1 | 10/2007 | Tucker |
| 2008/0067589 A1 | 3/2008 | Ito et al. |
| 2008/0108208 A1 | 5/2008 | Arevalo et al. |
| 2008/0169493 A1 | 7/2008 | Lee et al. |
| 2008/0169516 A1 | 7/2008 | Chung |
| 2008/0169535 A1 | 7/2008 | Butt et al. |
| 2008/0197439 A1 | 8/2008 | Goerlach et al. |
| 2008/0227250 A1 | 9/2008 | Ranade et al. |
| 2008/0237661 A1 | 10/2008 | Ranade et al. |
| 2008/0258198 A1 | 10/2008 | Bojarczuk et al. |
| 2008/0272409 A1 | 11/2008 | Sonkusale et al. |
| 2009/0057746 A1 | 3/2009 | Sugll et al. |
| 2009/0108350 A1 | 4/2009 | Cai et al. |
| 2009/0134468 A1 | 5/2009 | Tsuchiya et al. |
| 2009/0224319 A1 | 9/2009 | Kohli |
| 2009/0302388 A1 | 12/2009 | Cai et al. |
| 2009/0309140 A1 | 12/2009 | Khamankar et al. |
| 2009/0311837 A1 | 12/2009 | Kapoor |
| 2009/0321849 A1 | 12/2009 | Miyamura et al. |
| 2010/0012988 A1 | 1/2010 | Yang et al. |
| 2010/0038724 A1 | 2/2010 | Anderson et al. |
| 2010/0100856 A1 | 4/2010 | Mittal |
| 2010/0148153 A1 | 6/2010 | Hudait et al. |
| 2010/0149854 A1 | 6/2010 | Vora |
| 2010/0187641 A1 | 7/2010 | Zhu et al. |
| 2010/0207182 A1 | 8/2010 | Paschal |
| 2010/0270600 A1 | 10/2010 | Inukai et al. |
| 2011/0059588 A1 | 3/2011 | Kang |
| 2011/0073961 A1 | 3/2011 | Dennard et al. |

(56) References Cited

U.S. PATENT DOCUMENTS

| | | | |
|---|---|---|---|
| 2011/0074498 A1* | 3/2011 | Thompson et al. | 327/543 |
| 2011/0079860 A1 | 4/2011 | Verhulst | |
| 2011/0079861 A1 | 4/2011 | Shifren et al. | |
| 2011/0095811 A1 | 4/2011 | Chi et al. | |
| 2011/0147828 A1 | 6/2011 | Murthy et al. | |
| 2011/0169082 A1 | 7/2011 | Zhu et al. | |
| 2011/0175170 A1 | 7/2011 | Wang et al. | |
| 2011/0180880 A1 | 7/2011 | Chudzik et al. | |
| 2011/0193164 A1 | 8/2011 | Zhu | |
| 2011/0212590 A1 | 9/2011 | Wu et al. | |
| 2011/0230039 A1 | 9/2011 | Mowry et al. | |
| 2011/0242921 A1 | 10/2011 | Tran et al. | |
| 2011/0248352 A1 | 10/2011 | Shifren | |
| 2011/0294278 A1 | 12/2011 | Eguchi et al. | |
| 2011/0309447 A1 | 12/2011 | Arghavani et al. | |
| 2012/0021594 A1 | 1/2012 | Gurtej et al. | |
| 2012/0034745 A1 | 2/2012 | Colombeau et al. | |
| 2012/0056275 A1 | 3/2012 | Cai et al. | |
| 2012/0065920 A1 | 3/2012 | Nagumo et al. | |
| 2012/0108050 A1 | 5/2012 | Chen et al. | |
| 2012/0132998 A1 | 5/2012 | Kwon et al. | |
| 2012/0138953 A1 | 6/2012 | Cai et al. | |
| 2012/0146155 A1 | 6/2012 | Hoentschel et al. | |
| 2012/0167025 A1 | 6/2012 | Gillespie et al. | |
| 2012/0187491 A1 | 7/2012 | Zhu et al. | |
| 2012/0190177 A1 | 7/2012 | Kim et al. | |
| 2012/0223363 A1 | 9/2012 | Kronholz et al. | |
| 2012/0228716 A1 | 9/2012 | Harley et al. | |

FOREIGN PATENT DOCUMENTS

| | | |
|---|---|---|
| EP | 0531621 | 3/1993 |
| EP | 0683515 | 11/1995 |
| EP | 0889502 | 1/1999 |
| EP | 1450394 | 8/2004 |
| JP | 59193066 | 11/1984 |
| JP | 4186774 | 7/1992 |
| JP | 8153873 | 6/1996 |
| JP | 8288508 | 11/1996 |
| JP | 2004087671 | 3/2004 |
| KR | 794094 | 1/2008 |
| WO | WO2011/062788 | 5/2011 |

OTHER PUBLICATIONS

Samsudin, K et al., "Integrating Intrinsic Parameter Fluctuation Description into BSIMSOI to Forecast sub-15nm UTB SOI based 6T SRAM Operation", Solid-State Electronics (50), pp. 86-93 2006.

Wong, H et al., "Nanoscale CMOS", Proceedings of the IEEE, Vo. 87, No. 4, pp. 537-570, Apr. 1999.

Ohguro, T et al., "An 0.18-µm CMOS for Mixed Digital and Analog Aplications with Zero-Volt-Vth Epitaxial-Channel MOSFET's", IEEE Transactions on Electron Devices, vol. 46, No. 7, pp. 1378-1383, Jul. 1999.

Pinacho, R et al., "Carbon in Silicon: Modeling of Diffusion and Clustering Mechanisms", Journal of Applied Physics, vol. 92, No. 3, pp. 1582-1588, Aug. 2002.

Robertson, L.S et al., "The Effect of Impurities on Diffusion and Activation of Ion Implanted Boron in Silicon", Mat. Res. Soc. Symp. vol. 610, 2000.

Scholz, R et al., "Carbon-Induced Undersaturation of Silicon Self-Interstitials", Appl. Phys. Lett. 72(2), pp. 200-202, Jan. 1998.

Scholz, RF et al., "The Contribution of Vacancies to Carbon Out-Diffusion in Silicon", Appl. Phys. Lett., vol. 74, No. 3, pp. 392-394, Jan. 1999.

Stolk, PA et al., "Physical Mechanisms of Transient Enhanced Dopant Diffusion in Ion-Implanted Silicon", J. Appl. Phys. 81(9), pp. 6031-6050, May 1997.

Thompson, S et al., "MOS Scaling: Transistor Challenges for the 21st Century", Intel Technology Journal Q3' 1998, pp. 1-19, 1998.

Wann, C. et al., "Channel Profile Optimization and Device Design for Low-Power High-Performance Dynamic-Threshold MOSFET", IEDM 96, pp. 113-116, 1996.

Werner, P et al., "Carbon Diffusion in Silicon", Applied Physics Letters, vol. 73, No. 17, pp. 2465-2467, Oct. 1998.

Yan, Ran-Hong et al., "Scaling the Si MOSFET: From Bulk to SOI to Bulk", IEEE Transactions on Electron Devices, vol. 39, No. 7, Jul. 1992.

Abiko, H et al., "A Channel Engineering Combined with Channel Epitaxy Optimization and TED Suppression for 0.15µm n-n Gate CMOS Technology", 1995 Symposium on VLSI Technology Digest of Technical Papers, pp. 23-24, 1995.

Chau, R et al., "A 50nm Depleted-Substrate CMOS Transistor (DST)", Electron Device Meeting 2001, IEDM Technical Digest, IEEE International, pp. 29.1.1-29.1.4, 2001.

Ducroquet, F et al. "Fully Depleted Silicon-On-Insulator nMOSFETs with Tensile Strained High Carbon Content $Si_{1-y}C_y$ Channel", ECS 210th Meeting, Abstract 1033, 2006.

Ernst, T et al., "Nanoscaled MOSFET Transistors on Strained Si, SiGe, Ge Layers: Some Integration and Electrical Properties Features", ECS Trans. 2006, vol. 3, Issue 7, pp. 947-961, 2006.

Goesele, U et al., Diffusion Engineering by Carbon in Silicon, Mat. Res. Soc. Symp. vol. 610, 2000.

Hokazono, A et al., "Steep Channel & Halo Profiles Utilizing Boron-Diffusion-Barrier Layers (Si:C) for 32 nm Node and Beyond", 2008 Symposium on VLSI Technology Digest of Technical Papers, pp. 112-113, 2008.

Hokazono, A et al., "Steep Channel Profiles in n/pMOS Controlled by Boron-Doped Si:C Layers for Continual Bulk-CMOS Scaling", IEDM09-676 Symposium, pp. 29.1.1-29.1.4, 2009.

Holland, OW and Thomas, DK "A Method to Improve Activation of Implanted Dopants in SiC", Oak Ridge National Laboratory, Oak Ridge, TN, 2001.

Kotaki, H., et al., "Novel Bulk Dynamic Threshold Voltage MOSFET (B-DTMOS) with Advanced Isolation (SITOS) and Gate to Shallow-Well Contact (SSS-C) Processes for Ultra Low Power Dual Gate CMOS", IEDM 96, pp. 459-462, 1996.

Lavéant, P. "Incorporation, Diffusion and Agglomeration of Carbon in Silicon", Solid State Phenomena, vols. 82-84, pp. 189-194, 2002.

Noda, K et al., "A 0.1-µm Delta-Doped MOSFET Fabricated with Post-Low-Energy Implanting Selective Epitaxy" IEEE Transactions on Electron Devices, vol. 45, No. 4, pp. 809-814, Apr. 1998.

Banerjee, et al. "Compensating Non-Optical Effects using Electrically-Driven Optical Proximity Correction", Proc. of SPIE vol. 7275 72750E, 2009.

Cheng, et al. "Extremely Thin SOI (ETSOI) CMOS with Record Low Variability for Low Power System-on-Chip Applications", Electron Devices Meeting (IEDM), Dec. 2009.

Cheng, et al. "Fully Depleted Extremely Thin SOI Technology Fabricated by a Novel Integration Scheme Feturing Implant-Free, Zero-Silicon-Loss, and Faceted Raised Source/Drain", Symposium on VLSI Technology Digest of Technical Papers, pp. 212-213, 2009.

Drennan, et al. "Implications of Proximity Effects for Analog Design", Custom Integrated Circuits Conference, pp. 169-176, Sep. 2006.

Hook, et al. "Lateral Ion Implant Straggle and Mask Proximity Effect", IEEE Transactions on Electron Devices, vol. 50, No. 9, pp. 1946-1951, Sep. 2003.

Hori, et al., "A 0.1 µm CMOS with a Step Channel Profile Formed by Ultra High Vacuum CVD and In-Situ Doped Ions", Proceedsing of the International Electron Devices Meeting, New York, IEEE, US, pp. 909-911, Dec. 5, 1993.

Matshuashi, et al. "High-Performance Double-Layer Epitaxial-Channel PMOSFET Compatible with a Single Gate CMOSFET", Symposium on VLSI Technology Digest of Technical Papers, pp. 36-37, 1996.

Shao, et al., "Boron Diffusion in Silicon: The Anomalies and Control by Point Defect Engineering", Materials Science and Engineering R: Reports, vol. 42, No. 3-4, pp. 65-114, Nov. 1, 2003, Nov. 2012.

Sheu, et al. "Modeling the Well-Edge Proximity Effect in Highly Scaled MOSFETs", IEEE Transactions on Electron Devices, vol. 53, No. 11, pp. 2792-2798, Nov. 2006.

Scholz, R et al., "Carbon-Induced Undersaturation of Silicon Self-Interstitials", Appl. Phys. Lett. 72(2), pp. 200-202, Jan. 1998.

* cited by examiner

SEMICONDUCTOR STRUCTURE WITH REDUCED JUNCTION LEAKAGE AND METHOD OF FABRICATION THEREOF

TECHNICAL FIELD

The present disclosure relates in general to semiconductor devices and processing and more particularly to a semiconductor structure with reduced junction leakage and method of fabrication thereof.

BACKGROUND

Cost effective electronic manufacturing requires transistor structures and manufacturing processes that are reliable at nanometer scales and that do not require expensive or unavailable tools or process control conditions. While it is difficult to balance the many variables that control transistor electrical performance, finding suitable transistor dopant structures and manufacturing techniques that result in acceptable electrical characteristics such as junction leakage and threshold voltage levels are a key aspect of such commercially useful transistors.

BRIEF DESCRIPTION OF THE DRAWINGS

For a more complete understanding of the present disclosure and the advantages thereof, reference is now made to the following description taken in conjunction with the accompanying drawings, wherein like reference numerals represent like parts, in which.

DETAILED DESCRIPTION

FIGS. 1A-1H show a process flow for fabricating a semiconductor structure 100 with reduced junction leakage. The process will fabricate two field effect transistor (FET) devices, a NFET 102 and a PFET 104. The process begins in FIG. 1A where a substrate 106 is provided. Usually, substrate 106 is of a <100> or <111> silicon crystalline orientation. A mask 108 is formed on substrate 106 on the PFET 104 side of semiconductor structure 100. Mask 108 may be made of nitride, oxide, oxi-nitride, or other materials as desired to effectively block off the PFET 104 side of semiconductor structure 100. On the NFET 102 side of semiconductor structure 100, an optional P-well 110 may be implanted into substrate 106 using process conditions such as Boron implanted at an energy of about 60 keV to 120 keV and a dosage of about $1\times10^{13}$ to $3\times10^{13}$ atoms/cm$^2$.

Figure 1A:
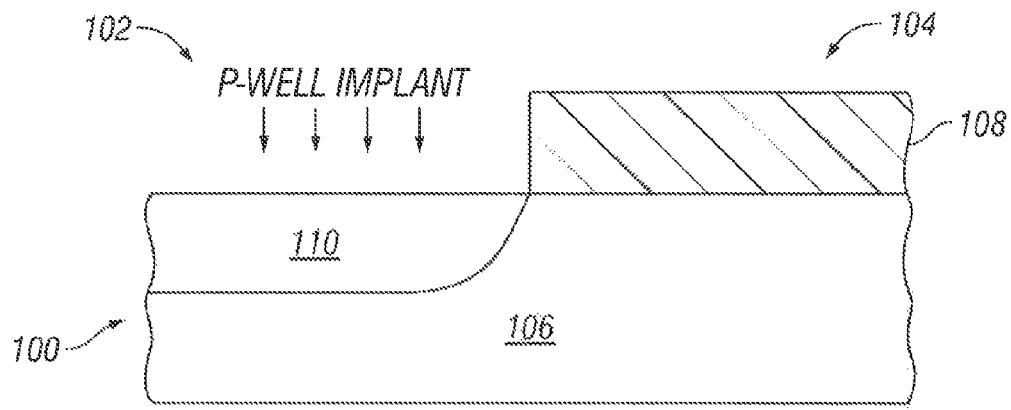
FIGS. 1A-1H illustrate a process flow for fabricating a semiconductor structure with reduced junction leakage.
Figure 1B:
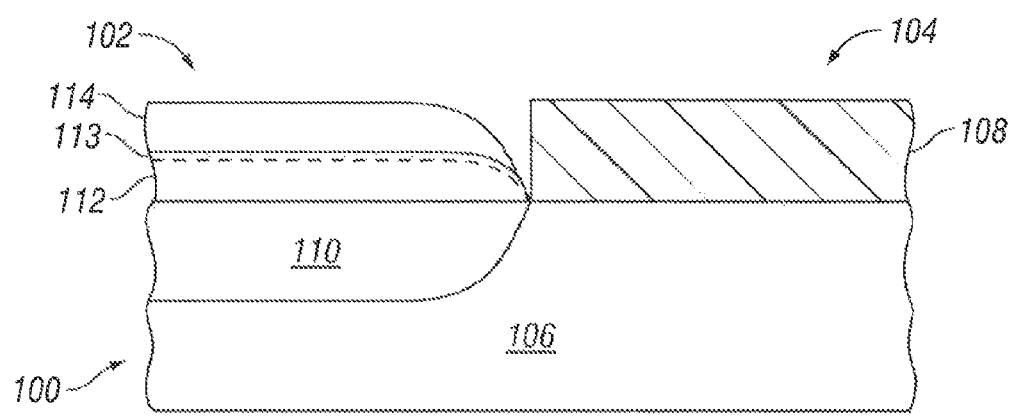

In FIG. 1B, a first layer at a preselected dopant concentration, preferably a screen layer 112 of the opposite dopant concentration type as to be used for the source and drain regions, is formed on substrate 106. Screen layer 112 may be formed by growing an epitaxial layer on substrate 106 and performing in-situ doping during the epitaxial layer growth so that the resulting concentration of dopants for screen layer 112 as grown is preferably within a range of about $5\times10^{18}$ to $5\times10^{19}$ atoms per cm$^3$ with a thickness of about 5 nm to 10 nm. Screen layer 112 establishes the depletion depth for NFET 102.

Example in-situ screen layer growth conditions include a 10 A dilute HF etch to reduce native oxide, an in-situ hydrogen bake at 700° C. to 850° C. for 45 to 75 sec and about 20 T, and a selective epitaxial growth process. Exemplary gases for the selective epitaxial growth process include H2/SiH2Cl2/HCl at about a 30/0.1/0.5 ratio, with dilute B2H6 and/or CH3SiH3 additive at about a 0.001 ratio sufficient to achieve the desired dopant concentration. The selective epitaxial growth may be performed at 700° C. to 850° C. and approximately 20 T.

For NFET 102, boron may be used as the dopant material in screen layer 112 to screen the well from activity in a second layer, preferably a channel layer 114. Maintaining a relatively abrupt or sharp dopant profile of the screen dopant helps control against junction leakage. Carbon is also preferably included as a non-electrically active additive to prevent unwanted diffusion of boron out of screen layer 112 during subsequent process steps. An example method to add the carbon is to turn on a dopant source 113 to introduce the carbon and boron dopant materials during epitaxial growth of screen layer 112.

In FIG. 1B, a second layer of a preselected dopant concentration, preferably channel layer 114 is formed on screen layer 112, preferably by epitaxial growth of an undoped intrinsic semiconductor material having a dopant concentration of no more than $5\times10^{17}$ atoms per cm$^3$ (that is, a silicon or other semiconductor material wherein electrically active species are not added to modify the conductivity characteristics; some impurities may be incidentally and unintentionally introduced into the crystalline lattice due to contamination from the process chamber; fabrication conditions are established such that channel layer 114 is maintained as essentially undoped at least beneath a later formed gate dielectric). Channel layer 114 may be formed by inserting substrate 106 into a separate epitaxial process chamber from that used for screen layer 112, or may remain in the same process chamber used for forming the doped screen layer 112 and grown by turning off dopant source 113 and using a gas mixture that does not include the dopants. Screen layer 112 and channel layer 114 are grown to preselected thicknesses based upon a target threshold voltage for NFET 102. In the epitaxial growth process, it may be desirable to delay turning on the in-situ doping and initially form an undoped epitaxial layer on substrate 106 and beneath screen layer 112 to allow for further adjustment of a location for screen layer 112 and to set up for a thinner channel layer 114. By being able to independently set a thickness for screen layer 112 and channel layer 114 along with the dopant concentration in screen layer 112, multiple threshold voltages that feature different depletion depths may be achieved with a similar device structure on a single semiconductor wafer. Though individually setting thicknesses for screen layer 112 and channel layer 114 may be desirable, a planar surface for semiconductor structure 100 may still be obtained as desired by maintaining the overall thickness for the channel layer and screen layer combination at a constant across all devices on substrate 106. In an alternative embodiment, channel layer 114 may be formed as a blanket epitaxial channel layer with the channel layer of PFET 104 later in the fabrication process.

An optional threshold voltage control layer 113 for NFET 102 may be formed between screen layer 112 and channel layer 114. The threshold voltage control layer 113 may be formed by further epitaxial growth on screen layer 112 using the same dopant type but with different doping conditions so that the resulting dopant concentration is about ⅒th that of screen layer 112 or is about ⅒th higher than that of channel layer 114. Epi thickness for the threshold voltage control layer 113 may be 5 nm to 10 nm in thickness. The in-situ doping conditions may be adjusted from the conditions for screen layer 112 to the conditions for the threshold voltage control layer 113 during epitaxial growth by reducing the concentration of the dopant species gas to result in the desired dopant concentration in the layer. Epitaxial growth of screen layer 112 and the threshold voltage control layer 113 may be continuously performed so as to avoid removing substrate 106 from the epitaxial growth process chamber. Alternatively, the threshold voltage control layer 113 can be formed using ion implantation either directly into screen layer 112 so that the threshold voltage control layer 113 is formed effectively at a top surface of screen layer 112, by ion implantation into an epitaxially grown layer, or, a threshold voltage control layer 113 can be formed using ion implantation after channel layer 114 is formed preferably by using a high enough implant energy to target a location of dopants to be at or just above the top surface of screen layer 112. The threshold voltage control layer 113 for NFET 102 is preferably added if screen layer 112 is not sufficient by itself to set the targeted threshold voltage for the device.

Figure 1C:
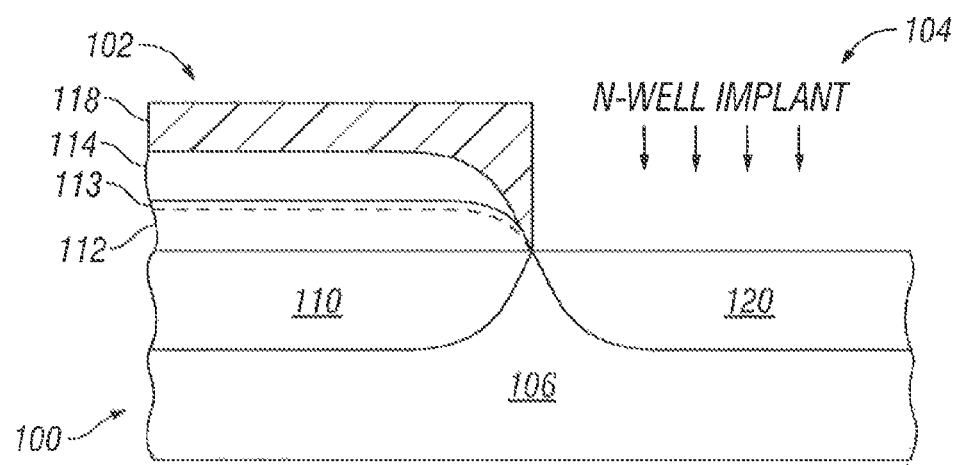

In FIG. 1C, mask 108 is removed to open the PFET 104 side of semiconductor structure 100 and a mask 118 is formed on substrate 106 on the NFET 102 side of semiconductor structure 100. Mask 118 may also be made of nitride, oxide, oxi-nitride, or other materials as desired to effectively block off the NFET 102 side of semiconductor structure 100. On the PFET 104 side of semiconductor structure 100, an optional N-well 120 may be implanted into substrate 106 using Arsenic or Phosphorus at an energy of about 100 keV to 200 keV with a dosage of $1\times10^{13}$ to $3\times10^{13}$ atoms/cm$^2$.

Figure 1D:
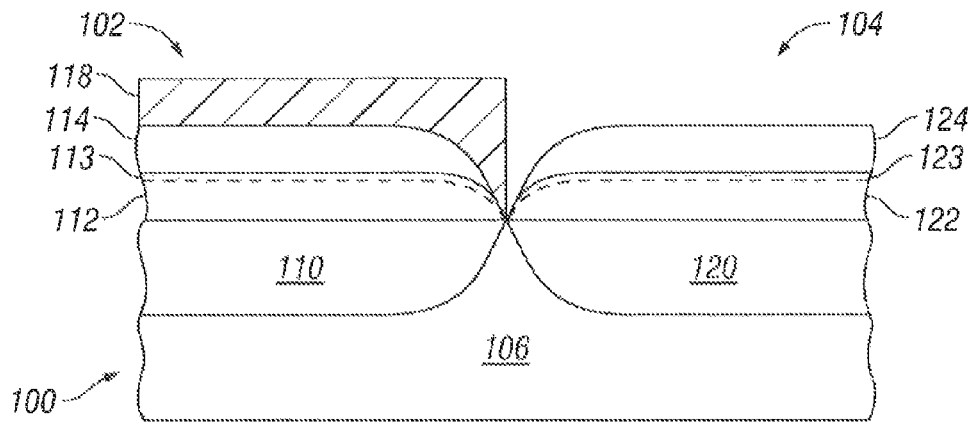

In FIG. 1D, a first layer of a preselected dopant concentration for the second FET, preferably a screen layer 122 of an opposite dopant concentration type as that used for source and drain regions, is formed on substrate 106. Screen layer 122 may be formed by growing an epitaxial layer on substrate 106 and performing in-situ doping during the epitaxial layer growth so that the resulting concentration of dopants for screen layer 122 is preferably within a range of about $5\times10^{18}$ to $5\times10^{19}$ atoms per cm$^3$ with a thickness of about 5 nm to 10 nm. Screen layer 122 establishes a depletion depth for PFET 104.

Example in-situ screen layer growth conditions include a 10 A dilute HF etch to reduce native oxide, an in-situ hydrogen bake at 700° C. to 850° C. for 45 to 60 sec and about 20 T, and a selective epitaxial growth process. Exemplary gases for the selective epitaxial growth process include H2/SiH2Cl2/HCl at about a 30/0.1/0.5 ratio, with dilute AsH3 sufficient to achieve the desired dopant concentration. The selective epitaxial growth may be performed at 700° C. to 850° C. and approximately 20 T.

For PFET 104, phosphorous or arsenic may be used as the in-situ dopant material in screen layer 122 to screen the well from activity in a second layer, preferably a channel layer 124. Maintaining a relatively abrupt or sharp dopant profile of the screen dopant helps to control against junction leakage.

In FIG. 1D, a second layer of a preselected dopant concentration for the second FET, preferably channel layer 124 is formed on screen layer 122 preferably by epitaxial growth of an undoped intrinsic semiconductor material having a dopant concentration of no more than $5\times10^{17}$ atoms per cm$^3$ (that is a silicon or other semiconductor material wherein electrically active species are not added to modify the conductivity characteristics; some impurities may be incidentally and unintentionally introduced into the crystalline lattice due to contamination from the process chamber; fabrication conditions are established such that channel layer 124 is maintained as essentially undoped at least beneath a later formed gate dielectric). Channel layer 124 may be formed by inserting substrate 106 into a separate epitaxial process chamber from that used for screen layer 122, or may remain in the same process chamber used for forming the doped screen layer 122 and grown by turning off dopant source 113 and using a gas mixture that does not include the dopants. Screen layer 122 and channel layer 124 are grown to preselected thicknesses based upon a target threshold voltage for PFET 104. In the epitaxial growth process, it may be desirable to delay turning on the in-situ doping and initially form an undoped epitaxial layer on substrate 106 and beneath screen layer 122 to allow for further adjustment of a location for screen layer 122 and to set up for a thinner channel layer 124. By being able to independently set a thickness for screen layer 122 and channel layer 124 along with the dopant concentration in screen layer 122, variations in threshold voltages and depletion depth from one PFET device to another may be achieved on a single semiconductor wafer. Though individually setting thicknesses for screen layer 122 and channel layer 124 may be desirable, a planar surface for semiconductor structure 100 may still be achieved by maintaining the overall thickness for the channel layer and screen layer combination at a constant across all devices on substrate 106. In an alternative embodiment, channel layer 124 may be formed as a blanket channel layer with channel layer 114 of NFET 104 later in the fabrication process.

An optional threshold voltage control layer 123 may be formed between screen layer 122 and channel layer 124. Similar to NFET 102, the threshold voltage control layer 123 for PFET 104 may be formed by further epitaxial growth on screen layer 122 using the same dopant type but with different doping conditions so that a resulting dopant concentration is about ⅒th that of screen layer 122 or is about ⅒th higher than that of channel layer 124 for a thickness of about 3 nm to 6 nm. Different doping materials may be used between screen layer 122 and the threshold voltage control layer 123. For example, arsenic may be used for screen layer 122 and phosphorous may be used for the threshold voltage control layer 123. The in-situ doping conditions may be adjusted from the conditions for screen layer 122 to the conditions for the threshold voltage control layer 123 during epitaxial growth by reducing the concentration of the dopant species gas. Epitaxial growth of screen layer 122 and the threshold voltage control layer 123 may be continuously performed so as to avoid removing substrate 106 from the epitaxial growth process chamber. Alternatively, the threshold voltage control layer 123 can be formed using ion implantation either directly into screen layer 122 so that the threshold voltage control layer 123 is formed effectively at the top surface of screen layer 122, by ion implantation into an epitaxially grown layer, or the threshold voltage control layer 123 may be formed using ion implantation after channel 124 is formed preferably by using a high enough implant energy to target a location of dopants to be at or just above the top surface of screen layer 122. The threshold voltage control layer 123 for PFET 104 is preferably added if screen layer 122 is not sufficient to set the targeted threshold voltage for the device.

Figure 1E:
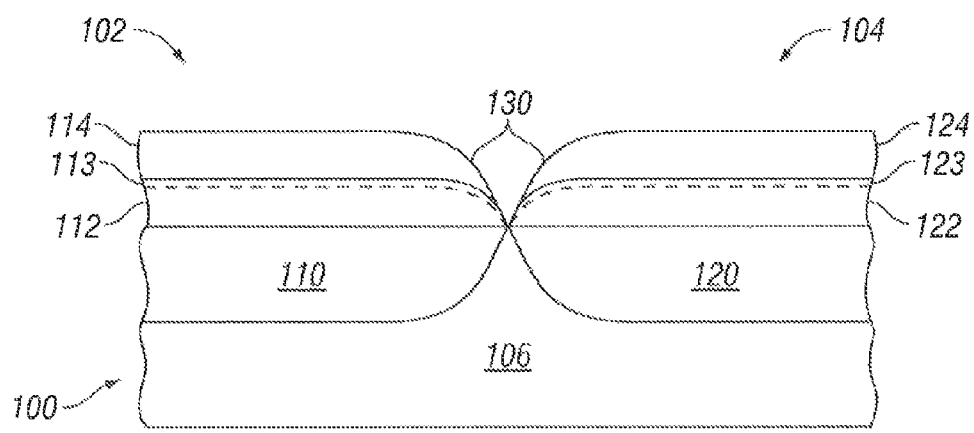

In FIG. 1E, mask 118 is removed. Due to the positioning of masks 108 and 118 and the epitaxial growth conditions, facets 130 are usually formed in each layer of each device. Facets 130 form at the boundary of growth areas and masking dielectric areas such as the NFET 102 and PFET 104 areas where the growth area is adjacent to mask areas 118 and 108. Facet 130 formation can vary from one epitaxial growth process to another through selection of temperature, pressure, chemistry/partial pressure, and starting substrate orientation. Facets are undesirable as they may introduce additional unwanted variations to the device that adversely affect device operation. These facets can be eliminated by performing a shallow trench isolation process after the selective epitaxial growth. It is noted that, prior to shallow trench isolation, in an alternative embodiment if channel layers 114 and 124 have not been previously formed, an undoped blanket channel layer may be epitaxially grown on substrate 106 and screen layers 112 and 122 in order to establish channel layers 114 and 124 by way of an epitaxial layer that extends between the FETs.

Figure 1F:
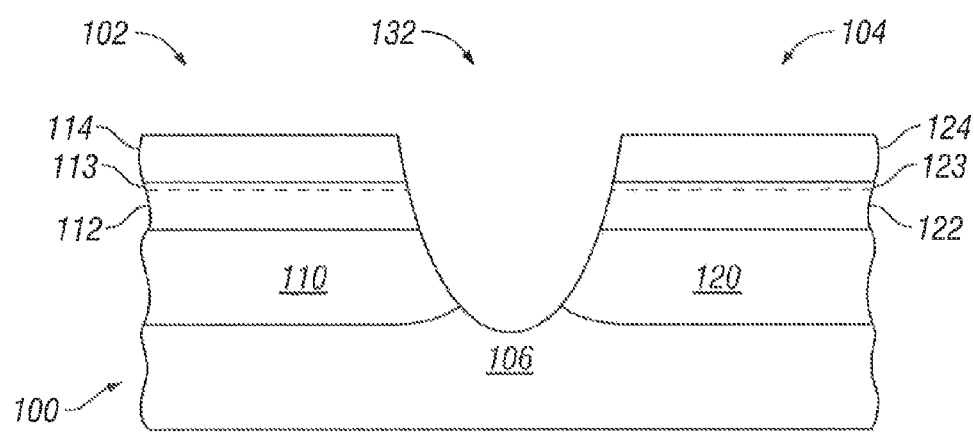
Figure 1G:
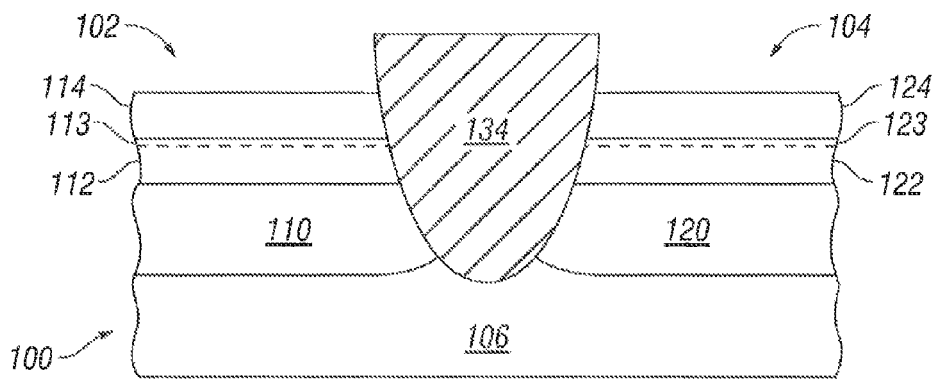
Figure 1H:
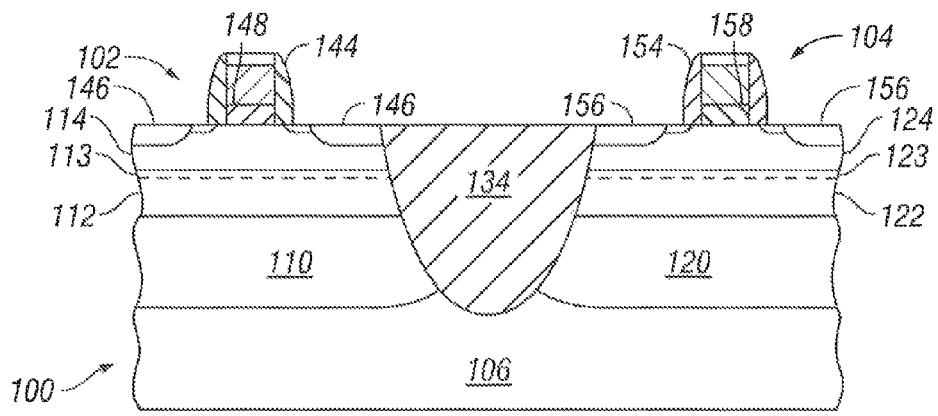

FIG. 1F shows the formation of a trench 132 between NFET 102 and PFET 104. Trench 132 is aligned with the boundary between NFET 102 and PFET 104, and is formed by applying masks to protect NFET 102 and PFET 104 and etching into substrate 106. Then an etch process is performed to remove material that is wider than the interface where the faceted structures come together, resulting in a trench structure that slices through and eliminates the facets. As shown in FIG. 1G, trench 132 is then filled using dielectric material, usually silicon oxide deposited by chemical vapor deposition, to establish a physical and electrical isolation region 134 between NFET 102 and PFET 104. Gate stack 144 and 154 and source/drain formations 146 and 156 are then established to complete the transistor devices as shown in FIG. 1H. In this manner, a device is established with a screen layer setting a depletion depth underneath the gate stack 144 and 154 and a channel layer overlying the screen layer is maintained undoped in contact with the gate dielectric 148 and 158 with an optional threshold voltage control layer between the screen layer and the channel layer.

Figure 2A:
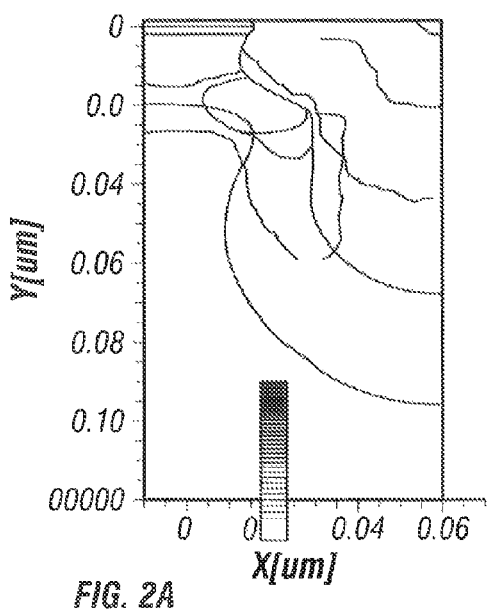
FIGS. 2A and 2B compare the band to band generation rate at the channel to the drain junction between an implanted screen layer embodiment versus an in-situ grown screen layer embodiment.
Figure 2B:
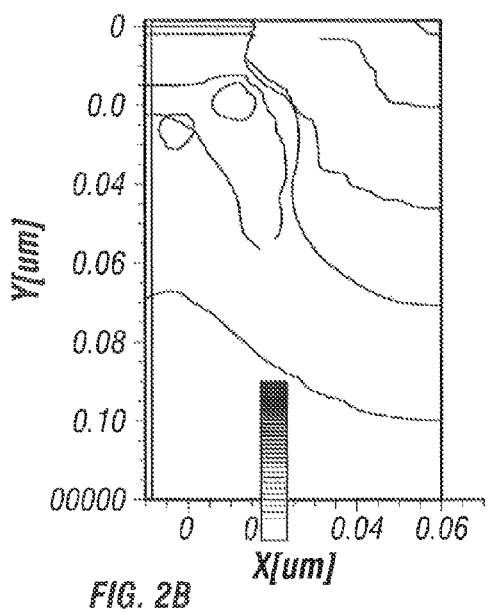

Advantages are obtained by forming screen layer 112 for NFET 102 by way of in-situ doped epitaxial growth as compared to ion implantation into substrate 106. FIG. 2A shows the band to band generation rate at the channel to drain junction for a dopant profile using an implanted screen layer. FIG. 2B shows the band to band generation rate at the channel to drain junction for a dopant profile using an in-situ doped epitaxially grown screen layer 112. The junction leakage, being a strong function of screen doping level and screen peak width, is reduced for the in-situ doped epitaxially grown screen layer 112 compared to the implanted screen layer. In FIG. 2A, a larger area of band to band tunneling generation rate is shown for an implanted screen layer in comparison of the smaller area of band to band tunneling process generation in FIG. 2B for the in-situ doped epitaxially grown screen layer 112. The more band to band tunneling generation rate there is, the more junction leakage is seen in a device.

Figure 3:
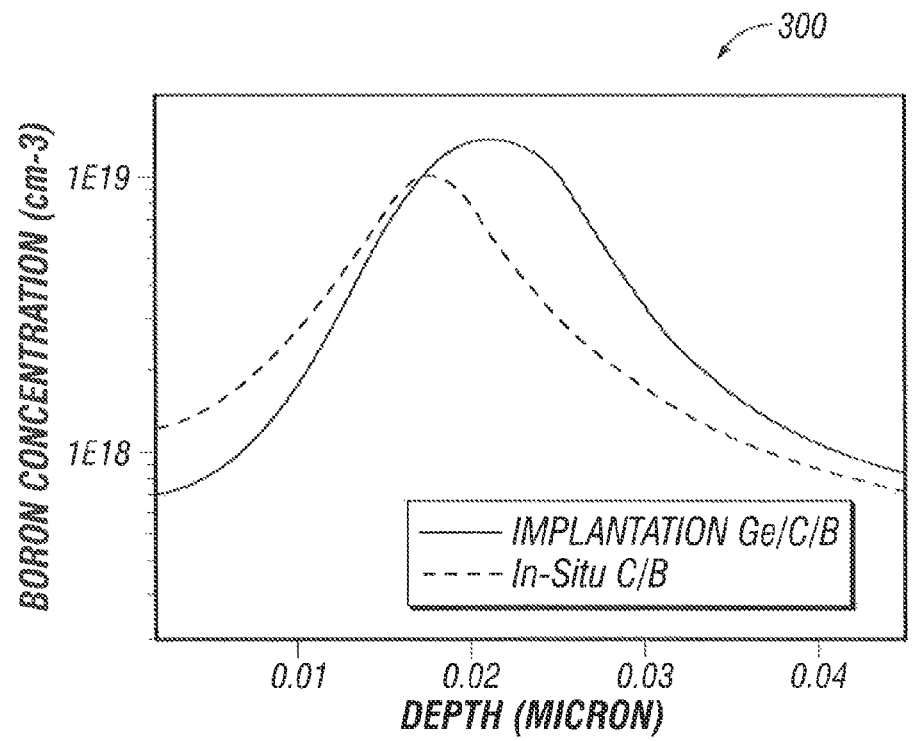
FIG. 3 illustrates a dopant concentration level comparison between an implanted screen layer and an in-situ grown screen layer.

The higher band to band tunneling process generation for the implanted screen layer is caused by a wider spread of the dopant peak as compared to an in-situ doped epitaxially grown screen layer. FIG. 3 shows a graph 300 with a dopant concentration level comparison between the implanted screen layer and the in-situ doped epitaxially grown screen layer 112. As shown in graph 300, the in-situ doped epitaxially grown screen layer 112 shows a narrower and lower doping peak as compared to the implanted screen layer, leading to the reduction in junction leakage. The concentration level of the in-situ doped epitaxially grown screen layer 112 is higher and closer to the silicon surface of the semiconductor structure than that of the implanted screen layer for the same threshold voltage setting. The higher dopant concentration nearer the substrate surface for the in-situ doped epitaxially grown screen layer 112 is disadvantageous in one respect in that there may be a slight increase in random dopant fluctuation (RDF) induced threshold voltage mismatch (AVT) as compared to the implanted screen layer. However, the tighter dopant distribution having the shorter tail improves junction leakage control drastically.

Figure 4:
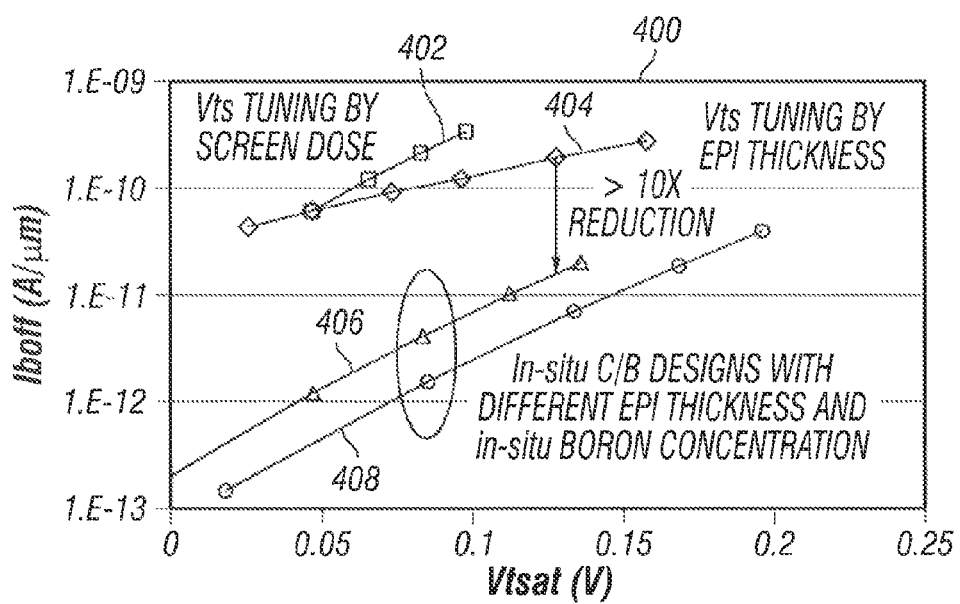
FIG. 4 illustrates differences in junction leakage between implanted and in-situ grown screen layers.

FIG. 4 shows a graph 400 with differences in junction leakage between the implanted screen layer and the in-situ epitaxially grown screen layer 112. Graph lines 402 and 404 show the plots for the implanted screen layer. Graph lines 406 and 408 show the plots for an in-situ grown screen layer. Graph line 402 shows how the threshold voltage can be tuned by changing the dose for the screen implant while keeping the channel layer thickness constant. Graph line 404 shows how the threshold voltage can be tuned by changing the thickness of the channel layer while keeping the dose for the screen implant constant. Similarly, graph line 406 shows how the threshold voltage for NFET 102 can be tuned by changing the in-situ boron concentration at a first thickness for the channel layer. Graph line 408 shows how the threshold voltage for NFET 102 can be tuned by changing the in-situ boron concentration at a second thickness for the channel layer. There are two advantages provided by the in-situ epitaxially grown screen layer 112 over the implanted screen layer. First, the in-situ epitaxially grown screen layer 112 allows for a more flexible threshold voltage targeting range than the implanted screen layer. Second, the in-situ epitaxially grown screen layer 112 provides a greater than ten times reduction in junction leakage as compared to the implanted screen layer. In addition, a thicker epitaxial channel layer may be used with an in-situ epitaxially grown screen layer 112 due to elimination of the implantation depth, relaxing the process constraints to grow a very thin epitaxial channel layer.

A reduction in junction leakage is achievable in a deeply depleted channel device by epitaxially growing a screen layer and in-situ doping of the screen layer during epitaxial growth. Any facets produced during epitaxial growth may be eliminated by forming an isolation region at a boundary of a NFET 102 and a PFET 104, preferably by cutting into substrate 106 and through a facet region by etching and filling a shallow trench.

Threshold voltage control can be achieved by selecting a dopant concentration for the screen layer, including a threshold control layer on the screen layer, and setting a thickness for the channel layer and the screen layer. From the foregoing, it may be appreciated by those of skill in the art that a need has arisen for a technique to fabricate a semiconductor structure with reduced junction leakage, threshold voltage controllability, and facetless physical properties in order to provide improved and consistent transistor operational performance. The above description discloses features that substantially eliminate or greatly reduce disadvantages and problems associated with previous transistor device fabrication and design. The present disclosure describes various technical advantages and features not present in previous transistor fabrication and design. Embodiments of the present disclosure may enjoy some, all, or none of these advantages. Other technical advantages may be readily apparent to one skilled in the art from the figures, description, and claims.

Although the present disclosure has been described in detail with reference to one or more particular embodiments, it should be understood that various other changes, substitutions, and alterations may be made hereto without departing from the scope of the appended claims. Although the present disclosure includes a description with reference to a specific ordering of processes, other process sequencing may be followed and other incidental process steps may be performed to achieve the end result discussed herein.

Numerous other changes, substitutions, variations, alterations, and modifications may be ascertained by those skilled in the art and it is intended that the present disclosure encompass all such changes, substitutions, variations, alterations, and modifications as falling within the spirit and scope of the appended claims. Moreover, the present disclosure is not intended to be limited in any way by any statement in the specification that is not otherwise reflected in the appended claims.

What is claimed is:

1. A method for forming a semiconductor structure, comprising:
   providing a substrate;
   forming a first masking layer for a first device area of the substrate;
   epitaxially growing a first layer for a first field effect transistor, the first layer having a defined dopant concentration and grown to a preselected thickness;
   epitaxially growing a second layer for the first field effect transistor on the first layer, the second layer having a preselected dopant concentration and grown to a preselected thickness;
   removing the first masking layer for the first device area of the substrate;
   forming a second masking layer for a second device area of the substrate;
   epitaxially growing a first layer for a second field effect transistor, said first layer for the second field effect transistor having a defined dopant concentration and grown to a preselected thickness;
   epitaxially growing a second layer for the second field effect transistor on the first layer for the second field effect transistor, the second layer for the second field effect transistor having a preselected dopant concentration and a preselected thickness;
   removing the second masking layer for the second device area of the substrate;
   wherein at least some of the epitaxially grown layers form facets at edges of the first and second masking layers, the facets being eliminated by forming an isolation region in an area of the facets, the isolation region isolating the first field effect transistor from the second field effect transistor.

2. The method of claim 1, wherein said step of forming the first layer for the first field effect transistor includes forming said first layer according to a preselected dopant concentration by introducing dopant species into the epitaxial process.

3. The method of claim 1, wherein said step of forming the second layer for the first field effect transistor includes forming a substantially undoped channel layer.

4. The method of claim 2, wherein said step of forming the second layer for the second field effect transistor includes forming said second layer according to a preselected dopant concentration by introducing dopant species into the epitaxial process.

5. The method of claim 4, wherein said step of forming the second layer for the second field effect transistor includes forming a substantially undoped channel layer.

6. The method of claim 1, further comprising:
   turning on a dopant source during epitaxial growth of the first layer for at least one of the first and second field effect transistors;
   turning off a dopant source during epitaxial growth of the second layer for the at least one of the first and second field effect transistors.

7. The method of claim 6, wherein epitaxial growth is continuously performed for the first layer and the second layer for the at least one of the first and second field effect transistors.

8. The method of claim 6, wherein the thickness of the first layer and the second layer for the at least one of the first and second field effect transistors is determined by when the dopant source is turned off.

9. The method of claim 8, wherein the thickness for the second layer of the first field effect transistor is different than the thickness for the second layer of the second field effect transistor.

10. The method of claim 1, further comprising:
    forming a threshold voltage control layer between the first layer and the second layer by epitaxial growth for at least one of the first and second field effect transistors, the threshold voltage control layer having a dopant concentration less than the first layer and greater than the second layer dopant concentration.

11. The method of claim 10, further comprising:
    using a first doping condition during epitaxial growth of the first layer for the at least one of the first and second field effect transistors;
    using a second doping condition during epitaxial growth of the threshold voltage control layer for the at least one of the first and second field effect transistors.

12. The method of claim 10, wherein epitaxial growth is continuously performed for the first layer, the threshold voltage control layer, and the second layer for the at least one of the first and second field effect transistors.

13. The method of claim 1, further comprising:
    forming a threshold voltage control layer for the at least one of the first and second field effect transistors, the threshold voltage control layer having a dopant concentration that is less than the dopant concentration of the first layer for the at least one of the first and second field effect transistors, the threshold voltage control layer being formed by ion implantation.

14. A semiconductor structure, comprising:
    a substrate;
    a first field effect transistor formed on the substrate, the first field effect transistor comprising:
       a first screen layer epitaxially grown on the substrate, the first screen layer having a first dopant and a first dopant concentration;
       a first channel layer epitaxially grown on the first screen layer, the first channel layer being undoped;
    a second field effect transistor, the second field effect transistor comprising:
       a second screen layer epitaxial grown on the substrate, the second screen layer having a second dopant and a second dopant concentration;
       a second channel layer epitaxially grown on the second screen layer, the second channel layer being undoped; and
    an isolation region separating the first field effect transistor from the second field effect transistor, the isolation region being formed after the formation of the first and second screen layers and first and second channel layers for the first and second filed field effect transistors;
    wherein a thickness of the first channel layer for the first field effect transistor is different than a thickness of the second channel layer for the second field effect transistor.

15. The semiconductor structure of claim 14, further comprising:

a threshold voltage control layer in the first field effect transistors, the threshold voltage control layer of the first field effect transistor being epitaxially grown on the first screen layer of the first field effect transistor, the threshold voltage control layer of the first field effect transistor having a dopant concentration less than the first screen layer first dopant concentration and greater than the first channel layer dopant concentration.

16. The semiconductor structure of claim 15, wherein the threshold voltage control layer is formed by ion implantation.

17. The semiconductor structure of claim 14, wherein the first channel layer and the first screen layer of the first field effect transistor are formed from a continuous epitaxial growth.

18. The semiconductor structure of claim 14, wherein the first screen layer or the second screen layer has a lower junction leakage due to epitaxial growth than a comparable ion implanted screen layer.

19. The semiconductor structure of claim 14, wherein a combined thickness for the first channel layer and the first screen layer of the first field effect transistor is a same thickness as a combined thickness for the second channel layer and the second screen layer of the second field effect transistor.

20. A semiconductor structure, comprising:
a substrate;
a first field effect transistor formed on the substrate, the first field effect transistor comprising:
  a first screen layer epitaxially grown on the substrate, the first screen layer having a first dopant and a first dopant concentration;
  a first channel layer epitaxially grown on the first screen layer, the first channel layer being undoped;
a second field effect transistor, the second field effect transistor comprising:
  a second screen layer epitaxial grown on the substrate, the second screen layer having a second dopant and a second dopant concentration;
  a second channel layer epitaxially grown on the second screen layer, the second channel layer being undoped; and
an isolation region separating the first field effect transistor from the second field effect transistor, the isolation region being formed after the formation of the first and second screen layers and first and second channel layers for the first and second field effect transistors;
wherein the first screen layer or the second screen layer has a lower junction leakage due to epitaxial growth than a comparable ion implanted screen layer.

* * * * *

UNITED STATES PATENT AND TRADEMARK OFFICE
CERTIFICATE OF CORRECTION

| | | |
|---|---|---|
| PATENT NO. | : 8,637,955 B1 | Page 1 of 1 |
| APPLICATION NO. | : 13/600647 | |
| DATED | : January 28, 2014 | |
| INVENTOR(S) | : Wang et al. | |

It is certified that error appears in the above-identified patent and that said Letters Patent is hereby corrected as shown below:

On the Title Page
Item (75) delete "Dalong Zhao, San Jose, AZ (US)" and insert --Dalong Zhao, San Jose, CA (US)--.

Signed and Sealed this
Nineteenth Day of August, 2014

Michelle K. Lee
*Deputy Director of the United States Patent and Trademark Office*